(12) United States Patent
Wang et al.

(10) Patent No.: US 10,209,744 B2
(45) Date of Patent: Feb. 19, 2019

(54) PORTABLE ELECTRONIC DEVICE

(71) Applicant: Acer Incorporated, New Taipei (TW)

(72) Inventors: Yung-Chih Wang, New Taipei (TW);
Jau-Han Ke, New Taipei (TW);
Wen-Neng Liao, New Taipei (TW);
Cheng-Wen Hsieh, New Taipei (TW)

(73) Assignee: Acer Incorporated, New Taipei (TW)

( * ) Notice: Subject to any disclaimer, the term of this patent is extended or adjusted under 35 U.S.C. 154(b) by 211 days.

(21) Appl. No.: 15/345,220

(22) Filed: Nov. 7, 2016

(65) Prior Publication Data

US 2018/0059730 A1 Mar. 1, 2018

(30) Foreign Application Priority Data

Aug. 26, 2016 (TW) .............................. 105127386 A

(51) Int. Cl.
*G06F 1/16* (2006.01)
*G06F 1/20* (2006.01)
*H05K 7/20* (2006.01)

(52) U.S. Cl.
CPC .......... *G06F 1/1656* (2013.01); *G06F 1/1626* (2013.01); *G06F 1/1635* (2013.01); *G06F 1/203* (2013.01); *H05K 7/20309* (2013.01); *G06F 2200/201* (2013.01)

(58) Field of Classification Search
CPC ................ G06F 1/20; G06F 1/203; G06F 1/181–1/182; G06F 1/1626; G06F 1/1656; G06F 1/1635; H05K 7/20309; H05K 7/20336; H01R 13/6581

USPC ....... 361/700, 702, 709, 712–715, 720, 800, 361/816; 165/80.4–80.5, 104.33; 257/706, 715, E23.088; 174/152, 548
See application file for complete search history.

(56) References Cited

U.S. PATENT DOCUMENTS

| 2005/0160752 A1* | 7/2005 | Ghoshal ................. G06F 1/203 62/259.2 |
| 2011/0277967 A1* | 11/2011 | Fried .................... F28D 15/0266 165/104.26 |
| 2014/0321058 A1* | 10/2014 | Fujieda .................. G06F 1/203 361/700 |
| 2015/0020998 A1* | 1/2015 | Hsieh ...................... G06F 1/20 165/104.21 |

(Continued)

FOREIGN PATENT DOCUMENTS

TW 272263 3/1996

*Primary Examiner* — Dion Ferguson
*Assistant Examiner* — Amir A Jalali
(74) *Attorney, Agent, or Firm* — J.C. Patents

(57) ABSTRACT

A portable electronic device includes a body, a heat source, an evaporator, a pipe, and at least one structural component. An inner space of the body is divided into a first space and a second space. The heat source is disposed at the first space and in thermal contact with the evaporator. The pipe is connected with the evaporator to form a loop and passes through at least one of the first space and the second space. At least a portion of the pipe surrounds and is in thermal contact with the structural component disposed inside the body. A working fluid is filled and is circulated in the loop. By absorbing heat in the evaporator, the working fluid in liquid state is vaporized to exit the evaporator. While passing through the pipe, the working fluid in vapor state dissipates heat to be condensed into liquid and flow into the evaporator.

6 Claims, 4 Drawing Sheets

(56) References Cited

U.S. PATENT DOCUMENTS

| | | | |
|---|---|---|---|
| 2015/0350392 A1* | 12/2015 | Park | H04M 1/0202 |
| | | | 455/575.6 |
| 2016/0007501 A1* | 1/2016 | Nakanishi | F28D 15/0266 |
| | | | 165/103 |
| 2016/0011635 A1* | 1/2016 | Hayashi | G06F 1/20 |
| | | | 361/679.53 |
| 2016/0044831 A1* | 2/2016 | Goh | G06F 1/181 |
| | | | 361/679.47 |
| 2016/0174414 A1* | 6/2016 | Molitor | H05K 7/20218 |
| | | | 361/673 |
| 2016/0259383 A1* | 9/2016 | Shioga | F28D 15/0266 |
| 2017/0020032 A1* | 1/2017 | Wang | G06F 1/203 |
| 2018/0177077 A1* | 6/2018 | Shioga | F28D 15/02 |

* cited by examiner

PORTABLE ELECTRONIC DEVICE

CROSS-REFERENCE TO RELATED APPLICATION

This application claims the priority benefit of Taiwan application serial no. 105127386, filed on Aug. 26, 2016. The entirety of the above-mentioned patent application is hereby incorporated by reference herein and made a part of this specification.

BACKGROUND

Field

The disclosure relates to a portable electronic device.

Description of Related Art

Along with the development of technology, the current trend in advancing mobile electronic devices is towards having slim appearance and lightweight, such that the structural arrangement tends to be compact so as to result in the problem of lacking space. In order to achieve both the desired performance and heat dissipation efficiency in the mobile electronic devices, a mechanical designer usually faces the difficulty in disposing components, which are necessary for achieving the desired performance, inside a limited space. At the same time, the mechanical designer needs to take the overall structure into account, so as to avoid the situation that the structural strength is insufficient. Therefore, it is troublesome for the mechanical designer to achieve both purposes.

Based on the above, how to provide an effective structural arrangement while achieving the heat dissipation efficiency is, in fact, requiring careful consideration of personnel in the field.

SUMMARY

The disclosure provides a portable electronic device having both effective spatial arrangement and heat dissipation efficiency.

A portable electronic device of the disclosure includes a body, a heat source, an evaporator, a pipe, and at least one structural component. An inner space of the body is divided into a first space and a second space separated from one another. The heat source is disposed at the first space. The evaporator is in thermal contact with the heat source. The pipe is connected with the evaporator to form a loop. A working fluid is filled in the loop, and the pipe passes through at least one of the first space and the second space. The structural component is disposed inside the body. At least a portion of the pipe surrounds and is in thermal contact with the structural component. By absorbing heat in the evaporator, the working fluid in liquid state is vaporized to exit the evaporator. While passing through the pipe, the working fluid in vapor state dissipates heat so as to be condensed into liquid and flow into the evaporator. Hence, the working fluid is circulated in the loop.

Based on the above, in the embodiments of the disclosure, the portable electronic device includes the evaporator having heat dissipation efficiency and the pipe arrangement in the body, wherein the evaporator and the pipe form the loop, and at least a portion of the pipe surrounds and is in thermal contact with the at least one structural component, so as to produce a compact structural arrangement and to achieve an effective use of space. At the same time, the pipe and the structural component are in thermal contact with each other, so the working fluid in vapor state can dissipate heat effectively while passing through the pipe and is condensed into liquid to flow in/return to the evaporator. Therefore, the working fluid is effectively circulated in the loop.

In order to make the aforementioned and other features and advantages of the disclosure more comprehensible, embodiments accompanying figures are described in detail below.

DESCRIPTION OF THE EMBODIMENTS

Figure 1:
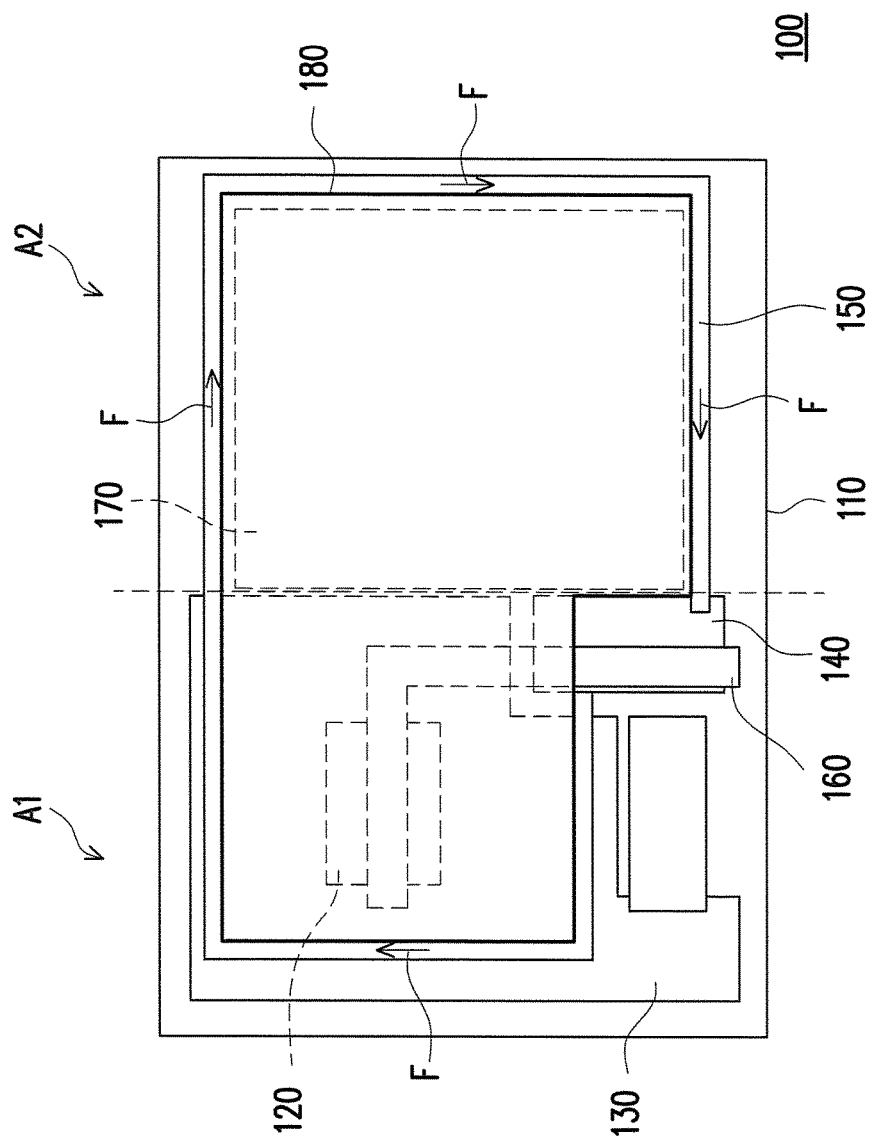
FIG. 1 is a schematic view of a portable electronic device according to an embodiment of the disclosure.

FIG. 1 is a schematic view of a portable electronic device according to an embodiment of the disclosure. In order to facilitate identification, only some components in the portable electronic device are depicted from the top view perspective. For example, one surface of the casing of the portable electronic device is removed to view the components inside, the omitted components can be learned from the existing technology and will not be repeated.

Referring to FIG. 1, in the present embodiment, a portable electronic device 100, such as a tablet computer, includes a body 110, a heat source 120, an evaporator 140, a pipe 150, and at least one structural component, and at least a portion of the pipe 150 surrounds and is in thermal contact with the at least one structural component. Furthermore, an inner space of the body 110 is divided into a first space A1 and a second space A2 separated from one another (the left and right space separated by the central dotted line shown in FIG. 1). The heat source 120 is, for example, a central processing unit or a display chip, etc., disposed on the circuit board 130 and generating a large amount of heat while processing in the portable electronic device 100, and the heat source 120 and the circuit board 130 are located at the first space A1. The evaporator 140 is in thermal contact with the heat source 120 through the heat pipe 160, so the heat generated by the heat source 120 is transmitted to the evaporator 140 via the heat pipe 160. The pipe 150 is connected with the evaporator 140 to form a loop, a working fluid F (as illustrated by the arrow inside the pipe 150) is filled in the loop, such that the working fluid F is circulated in the loop.

The reason the working fluid F is circulated in the loop is that, inside the evaporator 140, the working fluid F in liquid state is vaporized by absorbing heat generated by the heat source 120 to form a working fluid F in vapor state, and then the working fluid F in vapor state flows into the pipe 150 from the evaporator 140. Next, the working fluid F in vapor state dissipates heat so as to be condensed into liquid while passing through the pipe 150 and then flows into/return to the evaporator 140 to complete the circulation. Accordingly, the evaporator 140, the pipe 150, and the working fluid F inside the pipe 150 can form Two-phase Flow Thermosyphon Cooling loop.

More specifically, the at least one structural component of the present embodiment includes a battery 170 and an electromagnetic interference shielding component 180, the battery 170 is located at the second space A2, and the electromagnetic interference shielding component 180 is disposed at both the first space A1 and the second space A2. Namely, the electromagnetic interference shielding component 180 substantially covers the battery 170 and a part of the circuit board 130. Herein, the electromagnetic interference shielding component 180 is depicted using a thicker contour line, wherein the part of the electromagnetic interference shielding component 180 that is located at the first space A1 covers the heat source 120 and the a part of the heat pipe 160.

It is noted that the pipe 150 of the present embodiment surrounds the outer edges of the electromagnetic interference shielding component 180 and a part of the outer edges of the battery 170. From the top view, the pipe 150 substantially surrounds both the electromagnetic interference shielding component 180 and the battery 170. When the working fluid F flows into the pipe 150, the heat of the working fluid F in vapor state is dissipated and transmitted to the electromagnetic interference shielding component 180 and the battery 170 since the pipe 150 is in thermal contact with the electromagnetic interference shielding component 180 and the battery 170. Therefore, the working fluid F in vapor state is successfully condensed into liquid state and continues to flow into the evaporator 140 so as to complete the circulation.

Furthermore, in the process of transmitting the heat to the evaporator 140 via the heat pipe 160, a part of the heat generated by the heat source 120 and a part of the heat of the heat pipe 160 are both dissipated and transmitted to the electromagnetic interference shielding component 180 since the electromagnetic interference shielding component 180 is in thermal contact with the heat source 120 and the heat pipe 160, so that the electromagnetic interference shielding component 180 initially contribute to providing the heat dissipation efficiency. Accordingly, since the electromagnetic interference shielding component 180 is disposed at both the first space A1 and the second space A2, the portable electronic device 100 of the present embodiment can have a preferred heat capacity. Simultaneously, since the electromagnetic interference shielding component 180 has a large area, the heat is dissipated uniformly, such that the situation that the temperature at a part of the body 110 is excessively high cannot be happened.

In addition, not only does the electromagnetic interference shielding component 180 provide electromagnetic shielding effect for the heat source 120 or other electronic components (not shown) on the circuit board 130, the electromagnetic interference shielding component 180 also provides a preferred structural strength because of its large area, so as to provide durability for the portable electronic device 100. Herein, each of the electromagnetic interference shielding component 180 and the battery 170 dissipates 50% of the heat generated by the heat source 120.

Figure 2:
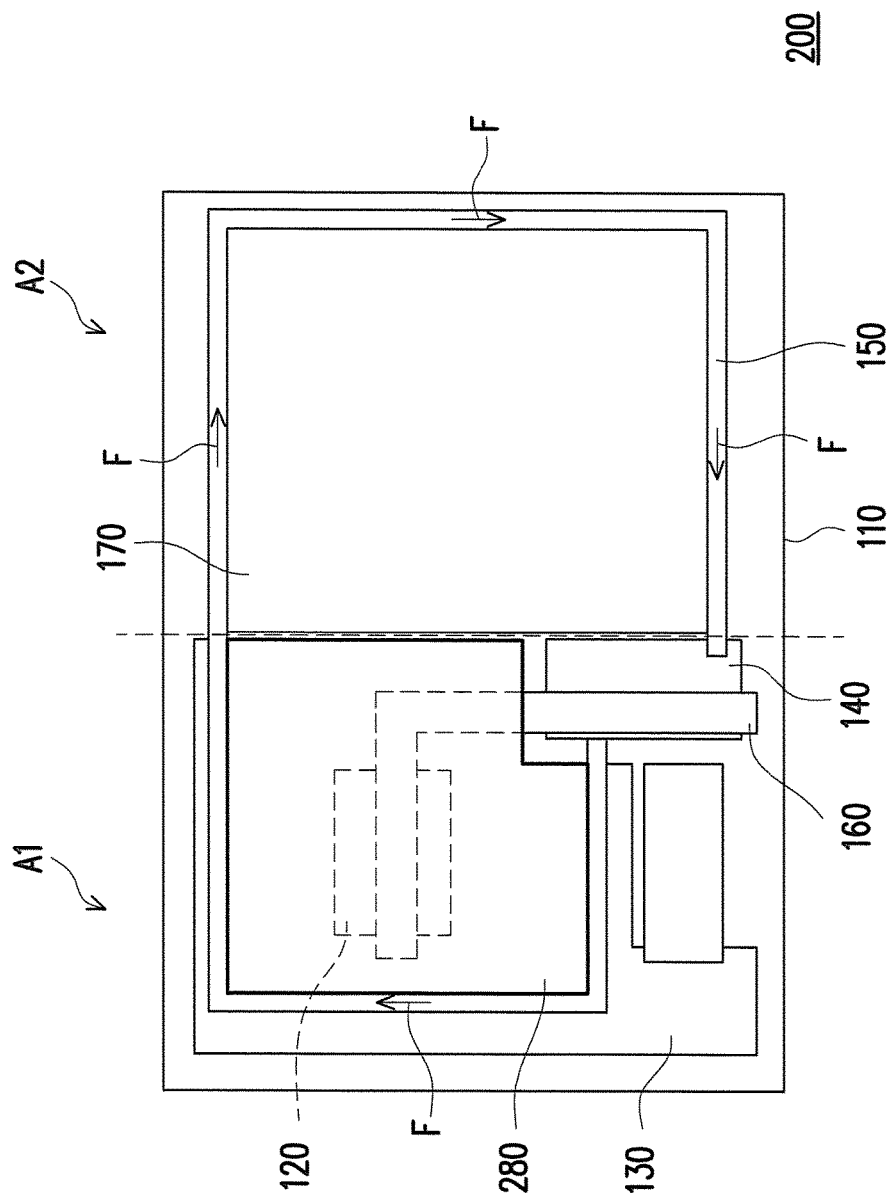
FIG. 2 is a schematic view of a portable electronic device according to another embodiment of the disclosure.

FIG. 2 is a schematic view of a portable electronic device according to another embodiment of the disclosure, which depicts in the same manner as the aforementioned embodiment. Referring to FIG. 2, the differences between the present embodiment and the aforementioned embodiment in FIG. 1 are that the electromagnetic interference shielding component 280 in the present embodiment is only disposed at the first space A1, so the electromagnetic interference shielding component 280 only covers the heat source 120, a part of the heat pipe 160, and a part of the circuit board 130.

In other words, the electromagnetic interference shielding component 280 of the present embodiment is mainly used for dissipating heat of the heat source 120, the heat pipe 160, and the a part of the pipe 150 that is located at the first space A1, and the part of the pipe 150 that is located at the second space A2 surrounds and in thermal contact with the battery 170. As a result, the structural components (the battery 170 and the electromagnetic interference shielding component 280) have distinct heat dissipation paths, and the second space A2 of the body 110 only accommodates the battery 170 and a part of the pipe 150, so as to further reduce the thickness of the body 110 at the second space A2. Hence, the portable electronic device 200 has a lightweight and slim appearance. Herein, since the electromagnetic interference shielding component 280 and the battery 170 are respectively disposed at the first space A1 and the second space A2, the electromagnetic interference shielding component 280 dissipates 30% of the heat generated by the heat source 120, and the battery 170 dissipates 70% of the heat generated by the heat source 120.

Figure 3:
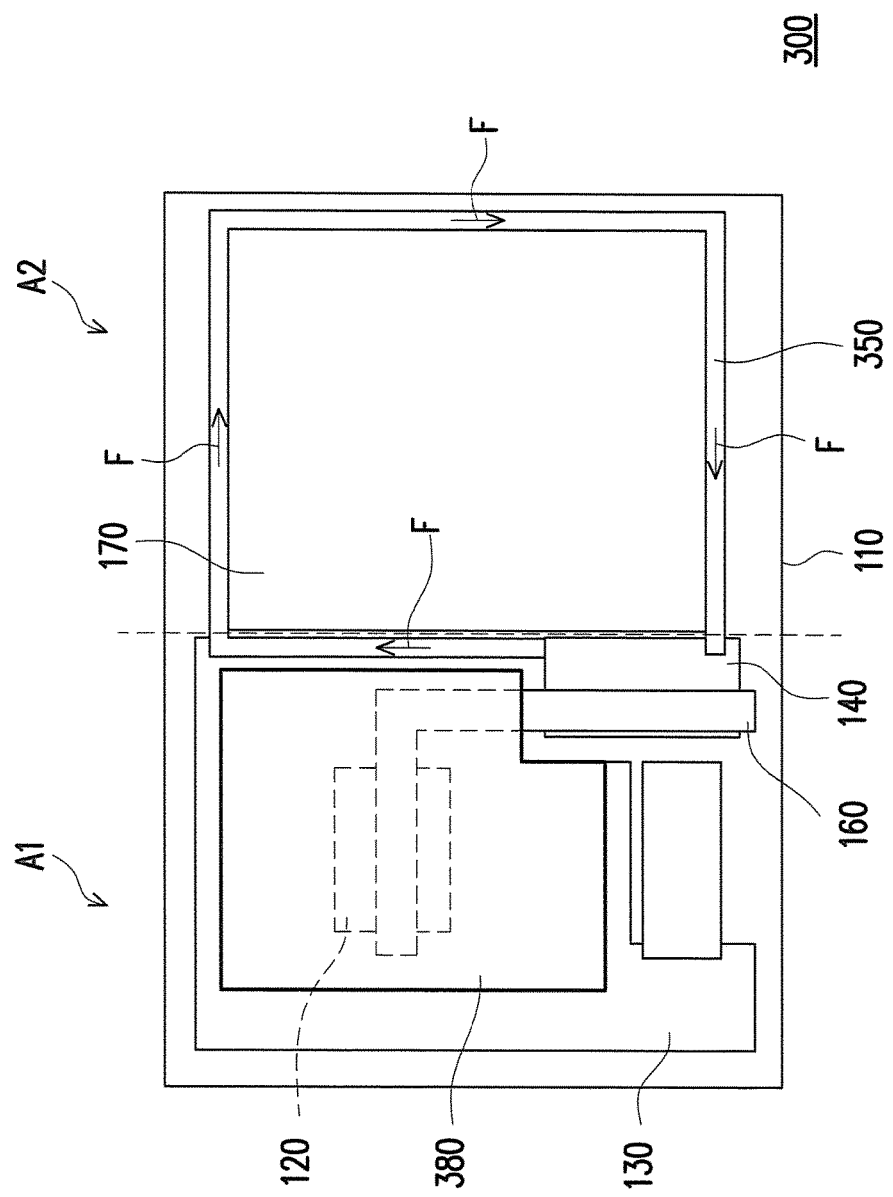
FIG. 3 is a schematic view depicting a portable electronic device according to another embodiment of the disclosure.

FIG. 3 is a schematic view depicting a portable electronic device according to another embodiment of the disclosure, which depicts in the same manner as the embodiments in FIG. 1 and FIG. 2. Referring to FIG. 3, in the present embodiment, the electromagnetic interference shielding component 380 of the portable electronic device 300 is only disposed at the first space A1 and covers the heat source 120, a part of the heat pipe 160, and a part of the circuit board 130. It should be noted here, the pipe 350 connected to the evaporator 140 is only disposed at the second space A2, so the pipe 350 surrounds and is in thermal contact with the battery 170. As a result, the electromagnetic interference shielding component 380 only dissipates heat of the heat source 120 and the heat pipe 160, and the pipe 350 depends entirely on the battery 170 to perform heat dissipation, such that distinct heat dissipation paths are provided to simplify the circulation and heat dissipation effect of the working fluid F. Certainly, since the electromagnetic interference shielding component 380 is only disposed at the first space A1, the body 110 of the present embodiment is similar as the body of the embodiment shown in FIG. 2 and also has a smaller thickness and a lighter weight. Herein, since the electromagnetic interference shielding component 380 and the battery 170 are respectively disposed at the first space A1 and the second space A2 and the pipe 350 is only located the second space A2 and surrounds the battery 170, the electromagnetic interference shielding component 380 dissipates 35% of the heat generated by the heat source 120, and the battery 170 dissipates 65% of the heat generated by the heat source 120.

Figure 4:
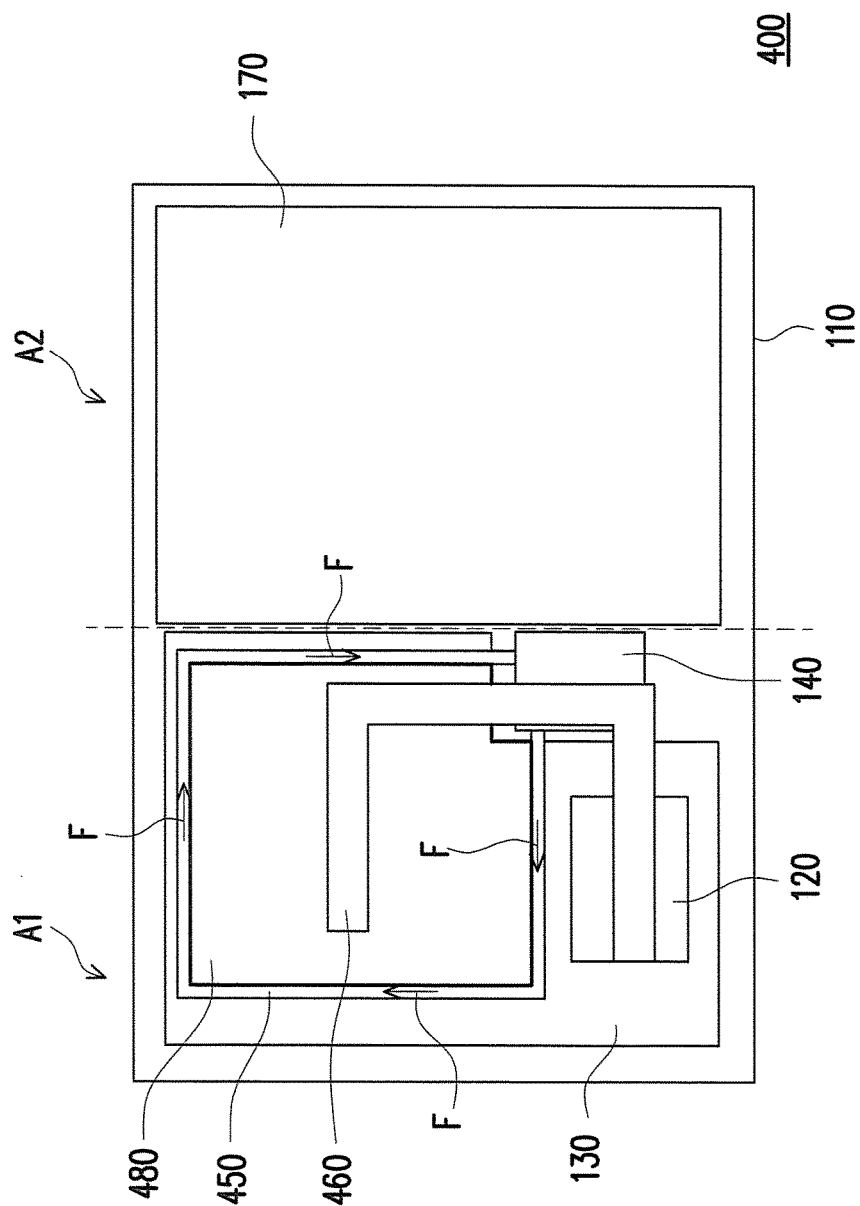
FIG. 4 is a schematic view depicting a portable electronic device according to another embodiment of the disclosure.

FIG. 4 is a schematic view depicting a portable electronic device according to another embodiment of the disclosure, which depicts in the same manner as the embodiments in FIG. 1 to FIG. 3. Referring to FIG. 4, in the present embodiment, the electromagnetic interference shielding component 480 of the portable electronic device 400 is only disposed at the first space A1 and covers a part of the circuit board 130, and the heat source 120 is disposed on the circuit board 130 and located outside the coverage of the electromagnetic interference shielding component 480. Furthermore, the pipe 450 is only disposed at the first space A1 and surrounds the electromagnetic interference shielding component 480. The heat pipe 460 is substantially disposed on the electromagnetic interference shielding component 480 and is simultaneously in thermal contact between the heat source 120 and the electromagnetic interference shielding component 480. Accordingly, the heat generated by the heat source 120 is transmitted to the evaporator 140 and the electromagnetic interference shielding component 480 via the heat pipe 460, and the heat of the pipe 450 is dissipated by the electromagnetic interference shielding component 480. Similar to the above-mentioned embodiments, the electromagnetic interference shielding component 480 and the battery 170 in the present embodiment are disposed separately to provide lightweight and slim appearance. Furthermore, since the battery 170 disposed at the second space A2 is not surrounded by the pipe 450, the battery 170 may have a larger area, such that the designer may adopt a battery having a larger power capacity to be the battery 170 and the compactness at the second space A2 is improved. Herein, 10% of the heat generated by the heat source 120 is dissipated before being transmitted to the evaporator 140 and the electromagnetic interference shielding component 480, the electromagnetic interference shielding component 480 dissipates 40% of the remaining heat generated by the heat source 120, and the pipe 450 dissipates 60% of the remaining heat generated by the heat source 120.

In summary, in the embodiments of the disclosure, the portable electronic device includes the evaporator having heat dissipation efficiency and the pipe arrangement in the body, wherein the evaporator and the pipe form the loop, and at least a portion of the pipe surrounds and is in thermal contact with the at least one structural component, so as to produce a compact structural arrangement and to achieve an effective use of space. At the same time, the pipe and the structural component are in thermal contact with each other, so the working fluid in vapor state can dissipate heat effectively while passing through the pipe and is condensed into liquid to flow in/return to the evaporator. Therefore, the working fluid is effectively circulated in the loop.

Otherwise, according to requirements and via different arrangements of the electromagnetic interference shielding component and the battery in the disclosure, a more compact design is disposed in the space inside the body so to increase the overall structural strength, or the electromagnetic interference shielding component and the battery are disposed separately into different spaces so as to obtain a smaller thickness and lighter weight of the body.

Although the disclosure has been disclosed with reference to the aforesaid embodiments, they are not intended to limit the disclosure. It will be apparent to one of ordinary skill in the art that modifications and variations to the described embodiments may be made without departing from the spirit and the scope of the disclosure. Accordingly, the scope of the disclosure will be defined by the attached claims and not by the above detailed descriptions.

What is claimed is:

1. A portable electronic device, comprising:
    a body, wherein an inner space of the body is divided into a first space and a second space separated from one another;
    a heat source, disposed at the first space;
    an evaporator, being in thermal contact with the heat source and absorbing heat from the heat source;
    a pipe, connected with the evaporator to form a loop, wherein a working fluid is filled in the loop, and the pipe passes through at least one of the first space and the second space;
    at least one structural component, disposed inside the body and at least one portion of the pipe is surrounded and in thermal contact with the at least one structural component, wherein the working fluid in liquid state is vaporized by absorbing heat in the evaporator to exit the evaporator, and the working fluid in vapor state dissipates heat so as to be condensed into liquid while passing through the pipe and then flows into the evaporator, such that the working fluid is circulated in the loop, and
    wherein the at least one structural component comprises a battery and an electromagnetic interference shielding component, the battery is disposed at the second space, and the electromagnetic interference shielding component is disposed at the first space.

2. The portable electronic device according to claim 1, wherein the pipe only surrounds the electromagnetic interference shielding component.

3. The portable electronic device according to claim 1, wherein the pipe only surrounds the battery.

4. The portable electronic device according to claim 1, wherein the pipe surrounds both the battery and the electromagnetic interference shielding component.

5. The portable electronic device according to claim 1, wherein the electromagnetic interference shielding component covers the heat source.

6. The portable electronic device according to claim 1, wherein the heat source is located outside a coverage of the electromagnetic interference shielding component.

* * * * *